United States Patent
Johansen et al.

(10) Patent No.: US 9,382,109 B2
(45) Date of Patent: Jul. 5, 2016

(54) MEMS MICROPHONE WITH REDUCED PARASITIC CAPACITANCE

(75) Inventors: Leif Steen Johansen, Kgs. Lyngby (DK); Jan Tue Ravnkilde, Hedehusene (DK); Pirmin Hermann Otto Rombach, Kongens Lyngby (DK); Kurt Rasmussen, Herlev (DK)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/261,875

(22) PCT Filed: Nov. 14, 2011

(86) PCT No.: PCT/EP2011/070070
§ 371 (c)(1),
(2), (4) Date: Aug. 13, 2014

(87) PCT Pub. No.: WO2013/071951
PCT Pub. Date: May 23, 2013

(65) Prior Publication Data
US 2014/0346620 A1 Nov. 27, 2014

(51) Int. Cl.
| | | |
|---|---|---|
| *B81B 3/00* | (2006.01) | |
| *H04R 1/22* | (2006.01) | |
| *H04R 19/00* | (2006.01) | |
| *H04R 19/04* | (2006.01) | |
| *H04R 31/00* | (2006.01) | |
| *B81C 1/00* | (2006.01) | |

(52) U.S. Cl.
CPC .......... *B81B 3/0086* (2013.01); *B81C 1/00158* (2013.01); *B81C 1/00698* (2013.01); *H04R 1/222* (2013.01); *H04R 19/005* (2013.01); *H04R 19/04* (2013.01); *H04R 31/00* (2013.01); *H04R 31/006* (2013.01); *H04R 2201/003* (2013.01)

(58) Field of Classification Search
CPC .... B81B 3/0086; H04R 31/006; H04R 1/222; H04R 19/05; H04R 19/04; H04R 31/00; B81C 1/158; B81C 1/698
USPC ............................. 257/416; 438/53; 428/131
See application file for complete search history.

(56) References Cited

U.S. PATENT DOCUMENTS

| | | |
|---|---|---|
| 6,847,090 B2 * | 1/2005 | Loeppert ....................... 257/418 |
| 8,098,870 B2 | 1/2012 | Kok et al. |
| 8,174,085 B2 | 5/2012 | Nakatani |

(Continued)

FOREIGN PATENT DOCUMENTS

| | | |
|---|---|---|
| DE | 102010008044 A1 | 8/2011 |
| EP | 2244490 A1 | 10/2010 |

(Continued)

OTHER PUBLICATIONS

Examination Report received in JP 2014540329, mailed May 20, 2015 (with partial English Translation) 6 pages.

*Primary Examiner* — Cuong Q Nguyen
*Assistant Examiner* — Tong-Ho Kim
(74) *Attorney, Agent, or Firm* — Slater Matsil, LLP

(57) ABSTRACT

A MEMS microphone has reduced parasitic capacitance. The microphone includes a trench electrically separating an acoustically active section of a backplate from an acoustically inactive section of the backplate.

13 Claims, 3 Drawing Sheets

(56) References Cited

U.S. PATENT DOCUMENTS

| | | |
|---|---|---|
| 8,664,733 B2 | 3/2014 | Rombach |
| 2006/0093171 A1 | 5/2006 | Zhe et al. |
| 2007/0121972 A1 | 5/2007 | Suzuki et al. |
| 2007/0281387 A1* | 12/2007 | Lutz et al. .................... 438/106 |
| 2009/0202089 A1 | 8/2009 | Zhang et al. |
| 2010/0194407 A1 | 8/2010 | Nakatani |
| 2011/0075865 A1 | 3/2011 | Yang et al. |
| 2012/0091546 A1* | 4/2012 | Langereis et al. ............ 257/416 |
| 2012/0326249 A1* | 12/2012 | Rombach ..................... 257/416 |

FOREIGN PATENT DOCUMENTS

| | | |
|---|---|---|
| JP | 2007208548 A | 8/2007 |
| JP | 2008546240 A | 12/2008 |
| JP | 2009218688 A | 9/2009 |
| JP | 2010098518 A | 4/2010 |
| JP | 2010175482 A | 8/2010 |
| JP | 2011055087 A | 3/2011 |
| WO | 2010139498 A1 | 12/2010 |
| WO | 2011101291 A1 | 8/2011 |

\* cited by examiner

MEMS MICROPHONE WITH REDUCED PARASITIC CAPACITANCE

This patent application is a national phase filing under section 371 of PCT/EP2011/070070, filed Nov. 14, 2014, which is incorporated herein by reference in its entirety.

TECHNICAL FIELD

The present invention relates to MEMS microphones with reduced parasitic capacitance and a method for manufacturing such microphones.

BACKGROUND

MEMS microphones usually comprise a conductive backplate and a conductive, flexible membrane arranged at a distance from the backplate. The backplate and the membrane realize electrodes of a capacitor. When a bias voltage is applied to the electrodes, oscillations of the membrane caused by received acoustic signals are converted into electrical signals. For further signal processing MEMS-microphones can comprise a ASIC (Application-specific Integrated Circuit) chip.

The microphone has a central region and a rim region. The central region is defined as the acoustically active region of the microphone. This central region is surrounded by the rim region that is acoustically inactive. Within the rim region, connection means for mechanically and/or electrically connecting the backplate and the membrane are arranged on a substrate material. For constructing MEMS microphones, manufacturing processes of semiconductor devices such as layer deposition, deposition of photo resist films, structuring photoresist films, and partly removing structured layers are utilized. The capacitor has an acoustically active section being defined by the acoustically active region of the microphone. Further, the capacitor has an acoustically inactive section being defined by the capacitor's section within the rim region.

A MEMS microphone comprises a system of stacked layers. However, the capacitor's acoustically inactive section deteriorates the performance of the microphone due to parasitic capacitance. The corresponding signal attenuation is:

$$H_c = C_m/(C_m + C_i + C_p), \quad (1)$$

where $C_i$ is the input capacitance of an according ASIC chip processing the electrical signal, and $C_p$ is the parasitic capacitance, i.e., the capacitance of the capacitor's acoustically inactive section. $C_m$ is the total capacitance comprising the capacitance of the rim region and the capacitance of the central region. It can be seen that reducing the parasitic capacitance reduces the signal's deterioration and, thus, improves the microphone's signal quality.

$C_p$ mainly depends on the acoustically inactive overlapping region of the backplate and the membrane.

SUMMARY OF THE INVENTION

Embodiments of the present invention provide a MEMS microphone with reduced parasitic capacitance and a method for manufacturing such a microphone.

A MEMS microphone comprises an acoustically active region and a rim region. The rim region surrounds the acoustically active region. The microphone further comprises a membrane in a membrane layer where the membrane has a section in the acoustically active region and a section in the rim region. The microphone further comprises a first backplate in a first backplate layer where the first backplate has a section in the acoustically active region and a section in the rim region. A first trench separates the membrane section of the rim region from the membrane section of the acoustically active region and/or the first backplate section of the rim region from the first backplate section of the acoustically active region.

The acoustically active region is the area in which the membrane can oscillate. The rim region is the area in which the membrane is stiffly connected to the body of the microphone being unable to oscillate. Separation means mainly electrical separation. It is possible that the separated regions are galvanically isolated. However, it is further possible that the electric resistance between the separated regions is increased. The resistance can be 10 GΩ, 100 GΩ, 1,000 GΩ, or 10,000 GΩ.

Although electrically mainly separated, there still exists a mechanical connection between the separated section of the acoustically active region and the body of the microphone. Of course, a small area within the rim region must not be separated from the respective section within the acoustically active region because means for electrical connection, e.g., for biasing the respective section, usually is arranged within the rim region.

Accordingly, a MEMS microphone is obtained in which the parasitic capacitance is decreased because the respective area within the rim region of the capacitor's electrode is electrically mainly decoupled from the microphone's capacitor.

In one embodiment, the first backplate further comprises a first backplate isolation layer and a first conductive backplate layer. The first conductive backplate layer is arranged between the first backplate isolation layer and the membrane. The first backplate isolation layer mechanically connects the first conductive backplate's section of the acoustically active region to the body of the microphone.

Thus, the acoustically active section of the backplate is mainly electrically separated from the inactive area of the electrode while the isolation layer establishes a mechanical connection to hold the backplate.

In one embodiment, the microphone further comprises an anchor element in the rim region of an anchor layer. The anchor layer is arranged between the first backplate and the membrane. The anchor element establishes a mechanical connection between the first backplate and the membrane. Further, the anchor element's thickness defines the equilibrium distance between the backplate and the membrane. As the anchor element establishes the mechanical connection between the first backplate and the membrane, it is preferred that the anchor element provides good adhesion properties. Therefore, the anchor element may comprise a silicon oxide, e.g., silicon dioxide $SiO_2$.

The first backplate isolation layer may mechanically be supported by the anchor element. It is possible that the first conductive backplate layer is arranged between the first backplate isolation layer and the anchor element.

In one embodiment, the microphone comprises a first backplate isolation layer and a first conductive backplate layer. The microphone further comprises a substrate on which the membrane is arranged. The substrate comprises Si (silicon). The membrane comprises polycrystalline silicon. The anchor layer comprises $SiO_2$ (silicon dioxide). The first conductive backplate layer comprises polycrystalline Si. The first backplate isolation layer comprises a material of low tensile or low compressive stress. Such a material may comprise a silicon nitride such as a non-stoichiometric silicon-rich nitride. Such a material is preferred because it helps maintaining a tensile stress in the backplate. Thus, a flat backplate is obtained.

During manufacturing, such a material can be deposited using a CVD (Chemical Vapor Deposition) method, such as a LP (Low Pressure) CVD method or a PE (Plasma Enhanced) CVD method.

In one embodiment, the microphone further comprises a second backplate. The second backplate comprises a second backplate isolation layer and a second conductive backplate layer. The second conductive backplate layer is arranged between the second backplate isolation layer and the membrane.

In other embodiments the second conductive layer can have a different position.

Thus, a double backplate microphone is obtained. Double backplate microphones usually provide a better signal/noise ratio and an improved THD (Total Harmonic Distortion) performance, although they demand for a signal amplifier working with balanced signals.

The section of the second backplate of the acoustically active region can also be separated from the section of the rim region by a trench in order to decrease the parasitic capacitance of the respective capacitor comprising the membrane and the second backplate as its electrodes.

In one embodiment, a double backplate microphone further comprises an isolation element in the rim region of the second conductive backplate layer. The isolation element electrically separates the second conductive backplate section of the acoustically active region from the second conductive backplate section of the rim region. In other words: the isolation element that is arranged in the same layer as the conductive backplate but contains an electric isolating material such as $SiO_2$ or a silicon nitride such as stoichiometric $Si_3N_4$ or non-stoichiometric $Si_xN_y$, surrounds the respective conductive element of the second backplate of the acoustically active region. Thus, the conductive element of the second backplate of the rim region is electrically decoupled from the capacitor comprising the second backplate and the membrane as electrodes.

In one embodiment, the microphone's membrane further comprises a first membrane isolation layer, a second membrane isolation layer and a conductive membrane layer being arranged between the two membrane isolation layers. A second trench electrically separates the conductive membrane layer's section of the rim region from the conductive membrane layer's section of the active region. Thus, again parasitic capacitance of the respective capacitor is decreased by electrically decoupling the inactive part of the membrane.

A method for manufacturing such a MEMS microphone comprises the steps:
providing a substrate,
providing and structuring a membrane on the substrate,
depositing an anchor layer onto the membrane,
depositing a backplate layer onto the anchor layer,
structuring the backplate and the anchor element,
structuring a trench in the backplate separating a central section of the backplate from a rim sided section of the backplate.

The number of backplates is not limited. A second backplate or even more backplates and more membranes can also be deposited and structured and applied with trenches.

BRIEF DESCRIPTION OF THE DRAWINGS

The basic idea of the invention and embodiments are shown in the figures.

DETAILED DESCRIPTION OF ILLUSTRATIVE EMBODIMENTS

Figure 1:
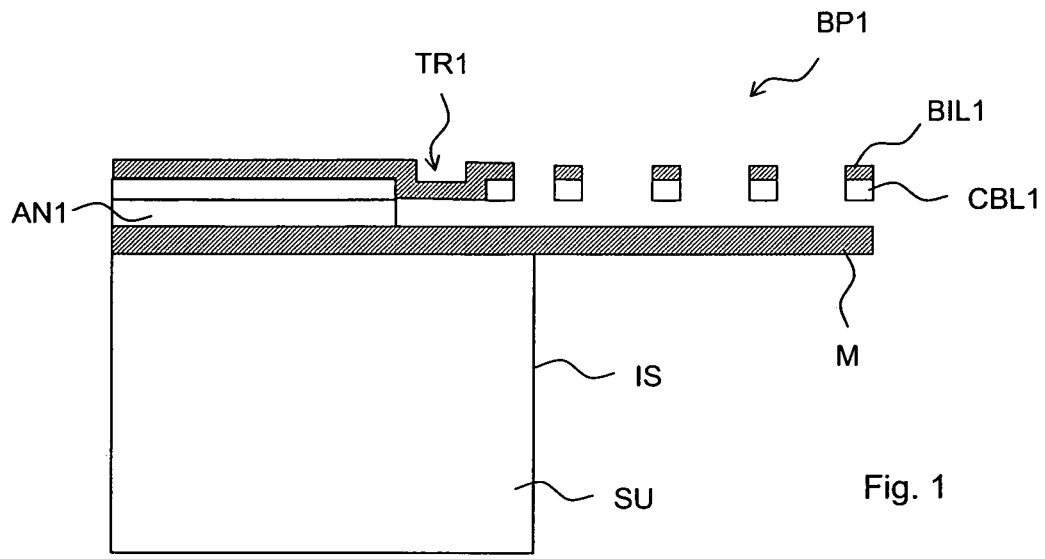
FIG. 1 shows a part of a microphone's cross-section comprising a trench separating a section of the backplate in the acoustically active region from a section of the backplate in the rim region.

FIG. 1 shows a cross-section of a segment of a MEMS microphone comprising a membrane M, a first conductive backplate layer CBL1 and a first backplate isolation layer BIL1. The first conductive backplate layer CBL1 and the first backplate isolation layer BIL1 establish the backplate of the microphone. A first anchor element AN1 is arranged between the first conductive backplate layer CBL1 and the membrane M. The membrane M, the layers of the first backplate and the first anchor element are arranged on a substrate SU. An inner surface IS of the substrate SU mainly defines the separation of the acoustically active region AAR from the rim region RR surrounding the acoustically active region AAR.

A first trench TR1 in the first backplate electrically separates the section of the first conductive backplate layer CBL1 of the acoustically active region from a section in the rim region RR. The first conductive backplate layer CBL1 of the first backplate and the membrane M establish the respective electrodes of the capacitor of the MEMS microphone. The rim-sided section of the first conductive backplate CBL1 does not contribute to the conversion of sound signals into electrical signals. In conventional microphones, this acoustically inactive part of the backplate contributes to the parasitic capacitance $C_p$ decreasing the signal quality of the microphone, compare equation (1).

As the first trench TR1 electrically decouples the section from the acoustically active section, the parasitic capacitance $C_p$ is reduced. Thus, the signal quality of the microphone is improved. Material of the first backplate isolation layer BIL1 mechanically connects the acoustically active section of the backplate to the microphone's body, e.g., to the rim-sided section of the first conductive backplate CBL1.

Figure 2:
FIG. 2 shows a schematic top view onto a MEMS microphone.
Figure 2:
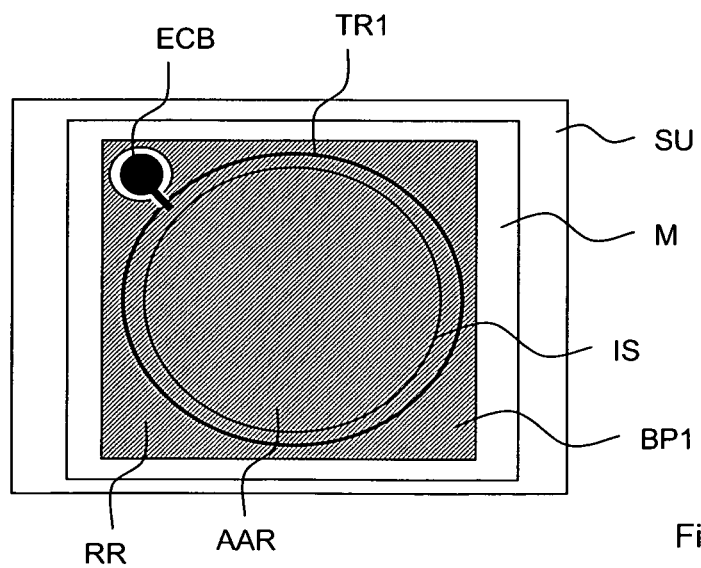

FIG. 2 shows a top view of a MEMS microphone. The microphone comprises a substrate SU on which a membrane M is arranged. The membrane M is arranged between the substrate SU and the backplate BP. The inner surface IS of the substrate mainly defines the edge between the acoustically active region AAR and the outer, rim-sided acoustically inactive region RR. The first trench TR1 electrically separates a rim-sided section of the backplate from a central, acoustically active section of the backplate. Thus, parasitic capacitance of the microphone's capacitor is reduced and the signal quality is improved. The microphone further comprises an electrical conduction element of the backplate ECB. This electrical conduction element ECB is arranged on the rim-sided section and electrically connected to the backplate BP of the acoustically active region AAR. The electrical connection element of the backplate ECB is electrically connected to the rim-sided section of the backplate that is separated from the centered section of the backplate by the first trench TR1.

Figure 3:
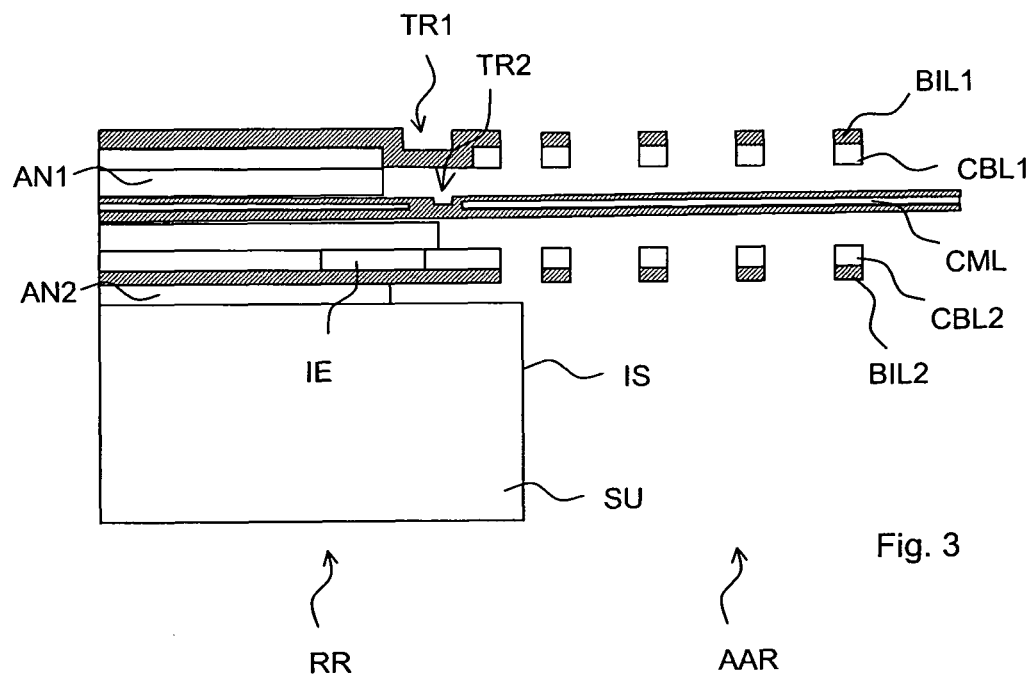
FIG. 3 shows a microphone's cross-section according to another embodiment.
Figure 4:
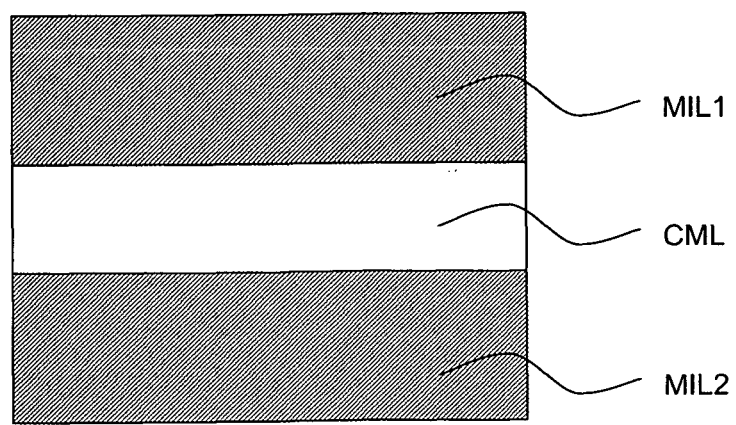
FIG. 4 shows a cross-section of a membrane.

FIG. 3 shows a part of a microphone's cross-section, where the microphone comprises two backplates. The first backplate comprises a first conductive backplate layer CBL1 and a first backplate isolation layer BIL1. The second backplate comprises a second conductive backplate layer CBL2 and a second backplate isolation layer BIL2. The membrane is arranged between both backplates and comprises a conductive membrane layer CML. FIG. 4 shows a cross-section of the membrane.

The embodiment of FIG. 3 further comprises a first anchor element AN1 being arranged between the first backplate and the membrane and a second anchor element AN2 being arranged between the second backplate and the substrate SU. A first trench TR1 electrically separates the central, acoustically active section of the first conductive backplate layer CBL1 from the section of the rim-sided region RR. A second trench TR2 electrically separates the section of the conductive membrane layer CML (compare FIG. 4) within the acoustically active region AAR from the respective layer of the rim region RR. Accordingly, the parasitic capacitance due to the rim-sided first backplate and the rim-sided membrane section and the second parasitic capacitance between the rim-sided section of a membrane and the rim-sided section of the second backplate is electrically decoupled from the sound converting system.

An isolating isolation element IE in the layer of the second conductive backplate layer CBL2 is arranged in the rim region RR and surrounds the section of the second conductive backplate layer CBL2 of the acoustically active region RR.

In conventional MEMS microphones backplates and membranes are coupled. This coupling may have influence on the shape of the backplate and the membrane after releasing the structures after or during a manufacturing step. Thus, stress from the backplate can manipulate the membrane, e. g., by feeding stress into the membrane. The position and the size of each trench, e. g., of FIG. 1-FIG. 3, can be chosen to reduce the degree of mechanical coupling between backplate membrane. Thus, microphones with reduced influence from the backplate onto the membrane—or vice versa—can be obtained.

FIG. 4 shows a cross-section of the membrane of FIG. 3 comprising a first membrane isolation layer MIL1 and a second membrane isolation layer MIL2 between which the conductive membrane layer CML is arranged.

Figure 5:
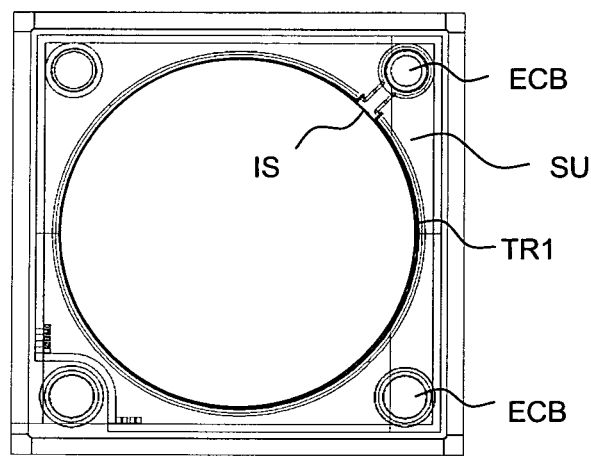
FIG. 5 shows a top view of a microphone comprising two electrical connection means.

FIG. 5 shows a schematic top view of a MEMS microphone comprising electrical contacts elements ECB. The electrical contact element of the backplate ECB is electrically connected to the backplate but mainly separated from the rim-sided section of the backplate. An electrical contact element contacting the membrane is electrically connected to the—acoustically active section of the—membrane but electrically separated from the rim-sided section of the membrane. The first trench TRI electrically separates the rim-sided section of the backplate from the central section of the backplate.

Figure 6:
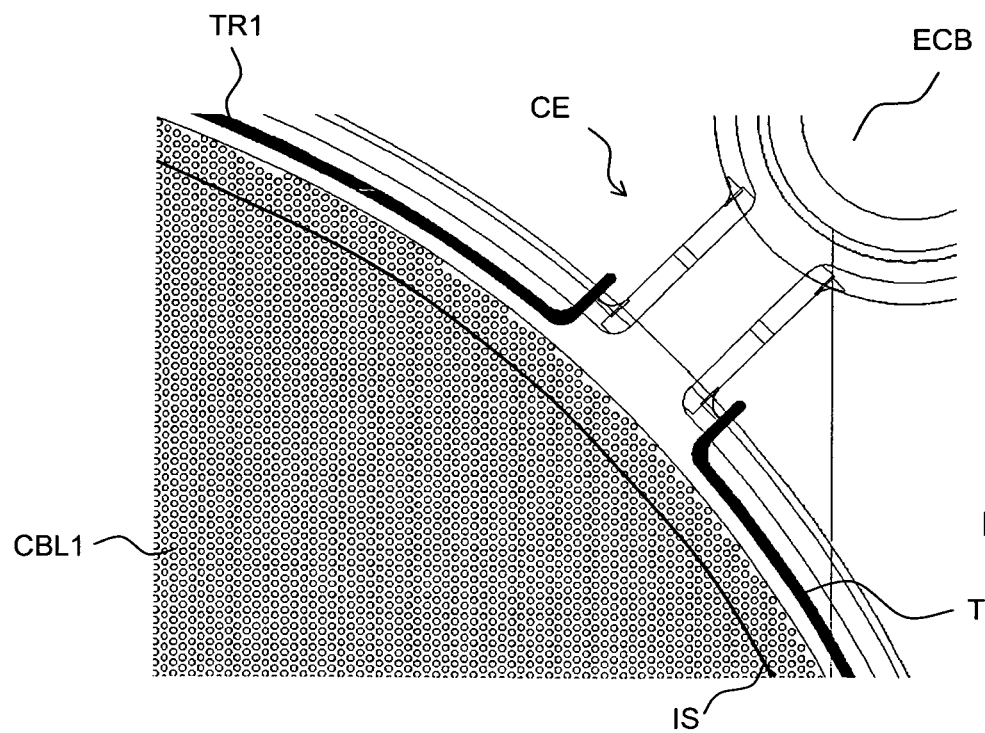
FIG. 6 shows details of the trench within the vicinity of an electrical connection means.

FIG. 6 shows the electrical connection element CE between the electrical contact element of the backplate ECB and the first conductive backplate layer CBL1. The first trench TR mainly surrounds the acoustically active region of the microphone. The inner surface IS of the substrate defines the edge between the acoustically active region and the rim region. The first trench TR1 does not fully surround the acoustically active region but leaves a small section and, thus, enables the connection element CE to electrically connect the electrical connection element of the backplate ECB with the first conductive backplate layer CLB1. The first trench TR1 may or may not spatially coincide with the inner surface IS. Even if the first trench TR1 is arranged within the rim region RR, the corresponding parasitic capacitance is still reduced and the signal quality of the microphone is improved.

A MEMS microphone is not limited to the embodiments described in the specification or shown in the figures. Microphones comprising further elements such as further layers, further trenches, electrical isolation elements or electrical connection means or combinations thereof are also comprised by the present invention.

The invention claimed is:

1. A MEMS microphone, comprising:
an acoustically active region;
a rim region surrounding the acoustically active region;
a membrane in a membrane layer, the membrane having a section in the acoustically active region and a section in the rim region;
a first backplate in a first backplate layer, the first backplate having a section in the acoustically active region and a section in the rim region; and
a first trench that electrically separates the membrane section of the rim region from the membrane section of the acoustically active region and/or the first backplate's section of the rim region from the first backplate's section of the acoustically active region, wherein a resistance between the separated regions is 10GΩ or more.

2. The MEMS microphone of claim 1, where the first backplate further comprises:
a first backplate isolation layer; and
a first conductive backplate layer arranged between the first backplate isolation layer and the membrane;
wherein the first backplate isolation layer mechanically connects the first conductive backplate layer's section of the acoustically active region to the microphone.

3. The MEMS microphone of claim 1, further comprising a first anchor element in the rim region of an anchor layer, where the anchor layer is arranged between the first backplate and the membrane.

4. The MEMS microphone of claim 3, comprising:
a first backplate isolation layer;
a first conductive backplate layer; and
a substrate on which the membrane is arranged.

5. The MEMS microphone of claim 4, wherein the substrate comprises Si;
wherein the membrane comprises polycrystalline Si;
wherein the anchor layer comprises $SiO_2$;
wherein the first conductive backplate layer comprises polycrystalline Si; and
wherein the first backplate isolation layer comprises silicon rich silicon nitride.

6. The MEMS microphone of claim 1, further comprising a second backplate, wherein the second backplate comprises a second backplate isolation layer and a second conductive backplate layer, and wherein the second conductive backplate layer is arranged between the second backplate isolation layer and the membrane.

7. The MEMS microphone of claim 6, further comprising an isolation element in the rim region of the second conductive backplate layer, wherein the isolation element separates the second conductive backplate layer of the acoustically active region from the second conductive backplate layer of the rim region.

8. The MEMS microphone of claim 1, wherein the membrane further comprises a first membrane isolation layer, a second membrane isolation layer and a conductive membrane layer arranged between the first and second membrane isolation layers, wherein a second trench electrically separates the conductive membrane layer's section of the rim region from the conductive membrane layer's section of the acoustically active region.

9. The MEMS microphone of claim 1, wherein the first trench separates the membrane section of the rim region from the membrane section of the acoustically active region.

10. The MEMS microphone of claim 1, wherein the first trench separates the first backplate's section of the rim region from the first backplate's section of the acoustically active region.

11. The MEMS microphone of claim 1, wherein the first trench both separates the membrane section of the rim region from the membrane section of the acoustically active region and the first backplate's section of the rim region from the first backplate's section of the acoustically active region.

12. A method for manufacturing a MEMS microphone, the method comprising:
   providing a substrate;
   structuring a membrane on the substrate, the membrane having a section in an acoustically active region and a section in a rim region;
   depositing an anchor layer onto the membrane;
   depositing a backplate layer onto the anchor layer;
   structuring a backplate and an anchor element, the backplate having a section in the acoustically active region and a section in the rim region; and
   structuring a trench in the backplate such that a central section of the backplate is electrically separated from a rim sided section of the backplate and a resistance between the central section of the backplate and the rim sided section is 10GΩ or more.

13. The method of claim 12,
   wherein the substrate comprises Si;
   wherein the membrane comprises polycrystalline Si; and
   wherein the anchor layer comprises $SiO_2$.

* * * * *